(12) United States Patent
Lin et al.

(10) Patent No.: US 7,365,015 B2
(45) Date of Patent: Apr. 29, 2008

(54) DAMASCENE REPLACEMENT METAL GATE PROCESS WITH CONTROLLED GATE PROFILE AND LENGTH USING $SI_{1-x}GE_x$ AS SACRIFICIAL MATERIAL

(75) Inventors: Hong Lin, Vancouver, WA (US); Wai Lo, Lake Oswego, OR (US); Sey-Shing Sun, Portland, OR (US); Richard Carter, Fairview, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/889,901

(22) Filed: Jul. 13, 2004

(65) Prior Publication Data

US 2006/0011994 A1   Jan. 19, 2006

(51) Int. Cl.
   *H01L 29/76* (2006.01)
(52) U.S. Cl. .................. 438/701; 438/713; 438/211; 438/257; 438/259; 438/592; 257/407
(58) Field of Classification Search ................ 257/407; 438/211, 257, 259, 701, 713, 592
See application file for complete search history.

(56) References Cited

U.S. PATENT DOCUMENTS

| | | | | |
|---|---|---|---|---|
| 6,159,861 A | * | 12/2000 | Asai et al. | 438/706 |
| 2002/0089003 A1 | * | 7/2002 | Lee | 257/288 |
| 2002/0155665 A1 | * | 10/2002 | Doris et al. | 438/279 |

OTHER PUBLICATIONS

Guillaumot, B. et al., "75nm Damascene Metal Gate and High-k Integration for Advanced CMOS Devices", 2002.
Yagishita, Atsushi et al., "High Performance Damascene Metal Gate MOSFEpT's for 0.1 μm Regime", IEEE Transactions on Electron Devices, vol. 47, No. 5, May 2000.
Tavel, B. et al., "High Performance 40 nm nMOSFETs With HfO2 Gate Dielectric and Polysilicon Damascene Gate", 2002.
Matsuo, Kouji et al., "High Performance Damascene Gate CMOSFETs with Recessed Cahannel Formed by Plasma Oxidation and Etching Method (RC-POEM)", 2002.

* cited by examiner

*Primary Examiner*—Edward Wojciechowicz
(74) *Attorney, Agent, or Firm*—Trexler Bushnell Giangiorgi & Blackstone Ltd.

(57) ABSTRACT

A method of forming a metal gate in a wafer. $PolySi_{1-x}Ge_x$ and polysilicon are used to form a tapered groove. Gate oxide, $PolySi_{1-x}Ge_x$, and polysilicon is deposited on a wafer. A resist pattern is formed. A portion of the polysilicon, $PolySi_{1-x}Ge_x$, and gate oxide is removed to provide a tapered profile. The resist is removed; a dielectric liner is deposited, and then at least a portion of the dielectric liner is removed, thereby exposing the polysilicon and leaving the dielectric liner in contact with the polysilicon, $PolyS_{1-x}Ge_x$, and gate oxide. A dielectric is deposited, and a portion is removed thereby exposing the polysilicon. The polysilicon, $PolySi_{1-x}Ge_x$, and gate oxide is removed from inside the dielectric liner, thereby leaving a tapered gate groove. Metal is then deposited in the groove.

14 Claims, 3 Drawing Sheets

DAMASCENE REPLACEMENT METAL GATE PROCESS WITH CONTROLLED GATE PROFILE AND LENGTH USING $SI_{1-X}GE_X$ AS SACRIFICIAL MATERIAL

BACKGROUND

The present invention generally relates to damascene metal gate processes, and more specifically relates to a damascene metal gate process which uses $Si_{1-x}Ge_x$ as a sacrificial member.

The aggressive scaling of metal oxide semiconductor (MOS) devices is quickly reaching the fundamental limits of $SiO_2$ as the gate dielectric. Scaling requirements can no longer be achieved with $SiO_2$ or nitrided-$SiO_2$ gate dielectrics due to the presence of excessive leakage currents arising from direct tunneling and the lack of manufacturability of sub-1 nm oxides. Moreover, poly-Si depletion and threshold voltage shifts due to boron penetration into the channel region severely degrade device performance. Replacement of $SiO_2$-based gate dielectrics with a high dielectric constant (high-k) material provides a means to address scaling issues. A high-k material allows for a physically thicker film to meet the required gate capacitance, while reducing the leakage current due to direct tunneling and improving manufacturability.

The issue of poly-Si depletion is still not overcome when using a high-k material, since the 3-6A contribution to EOT due to poly-Si depletion is still about 30-50% of the target EOT. As a result, the semiconductor industry began investigating metal gate electrodes. Replacement of poly-Si with a metal electrode solves both the boron penetration and poly-Si depletion issues. Moreover, the introduction of metal gates can prolong the use of $SiO_2$ for one or two technology generations for high performance applications before requiring a switch to high-k dielectrics.

A major challenge to the introduction of metal electrodes is addressing the issue of how to integrate the material into conventional transistor processing. In the case of CMOS and partially depleted SOI, two metal types will be needed, one with an n-type work function and one with a p-type work function. In the case of fully depleted SOI, a single metal with a mid-gap work function can be used. Whether one type or two types of metals are used, the integration question is still open. Many candidate metals will not sustain a standard source/drain activation anneal due to either reaction with the gate dielectric or the low melting temperature of many metal materials. In order to increase the number of candidate metal materials, a replacement gate approach is very appealing.

A replacement gate approach using a damascene scheme has been proposed previously, and is illustrated in FIGS. 1-5. As shown in FIG. 1, the approach provides that polysilicon dummy gates 10 are fabricated using standard polysilicon gate CMOS process flow until the formation source/drain (wherein the source is identified with reference numeral 12 in FIG. 1 and the drain is identified with reference numeral 14 in FIG. 1). Then, as shown in FIG. 2, pre-metal dielectric 16 is deposited on the silicon wafer 18 and a dielectric CMP planarization process is performed (as represented by arrows 20 in FIG. 2). The dummy polysilicon 10 and gate oxide 22 are then removed by reactive ion etching (RIE) and/or wet chemical etching to form a gate groove 24 as shown in FIG. 3. As shown in FIG. 4, a new gate dielectric ($SiO_2$ or high-k dielectric) 26 and metal gate 28 are grown and/or deposited on the wafer and, as shown in FIG. 5, a CMP step is performed (represented by arrows 30 in FIG. 5) to finally form the metal gate electrode 32. The main advantage of using a damascene process is that it avoids the thermal and plasma damages to the gate dielectric and metal electrode stacks during source/drain ion implantation, activation annealing and gate RIE.

A major problem of the existing damascene replacement scheme for metal gates is associated with the dummy polysilicon profile. The standard CMOS polysilicon gate etch process in general can only achieve a tapered polysilicon profile 40 with an angle of 87-89 degrees as shown in FIG. 6 (i.e., the polysilicon will have an actual profile such as that which is shown in FIG. 6, as opposed to the theoretical profile depicted in FIG. 1) causing a re-entrant gate groove 42 as shown in FIG. 7 (i.e., the gate groove will have an actual profile such as that which is shown in FIG. 7 as opposed to the theoretical profile depicted in FIG. 3). This leads to the following disadvantages of the scheme:

(a). Dummy polysilicon residue 44 as illustrated in FIG. 7: Incomplete removal of dummy polysilicon on the sidewall, especially when a RIE is used to remove the dummy polysilicon.

(b). Incomplete dummy gate dielectric removal or undercut beneath residue polysilicon.

(c). Difficulty of groove filling with new gate dielectric and metal electrode. Voids could be formed due to the lack of gap filling capability for the gate dielectric and metal electrode inside these narrow and high aspect ratio grooves, which will in turn limit the scalability of this scheme for the future technology nodes.

OBJECTS AND SUMMARY

An object of an embodiment of the present invention is to provide a method of forming a metal gate in a wafer which does not result in polysilicon residue being left in a groove before the groove is filled with metal.

Another object of an embodiment of the present invention is to provide a method of forming a metal gate in a wafer wherein a tapered groove is formed that tapers from an opening at its top to the bottom of the groove.

Yet another object of an embodiment of the present invention is to provide a metal gate in a wafer, where there is a groove which has a tapered profile which converges from an opening to a base, and there is metal in the groove, thereby providing the metal gate.

Briefly, and in accordance with at least one of the foregoing objects, an embodiment of the present invention provides a method of forming a metal gate in a wafer wherein $PolySi_{1-x}Ge_x$ is used as a sacrificial member to form a tapered groove. Specifically, gate oxide, $PolySi_{1-x}Ge_x$, and polysilicon is deposited on a wafer. A resist pattern is formed. A portion of the polysilicon, $PolySi_{1-x}Ge_x$, and gate oxide is removed to provide a tapered profile. The resist is removed; a dielectric liner is deposited, and then at least a portion of the dielectric liner is removed, thereby exposing the polysilicon and leaving the dielectric liner in contact with the polysilicon, $PolySi_{1-x}Ge_x$, and gate oxide. A dielectric is deposited, and a portion is removed thereby exposing the polysilicon. The polysilicon, $PolySi_{1-x}Ge_x$, and gate oxide is removed from inside the dielectric liner, thereby leaving a tapered gate groove. Metal is then deposited in the groove.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
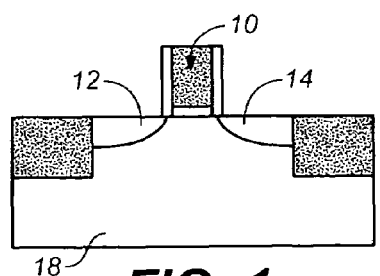
FIGS. 1-7 are views which relate to a prior art damascene metal gate process.
Figure 2:
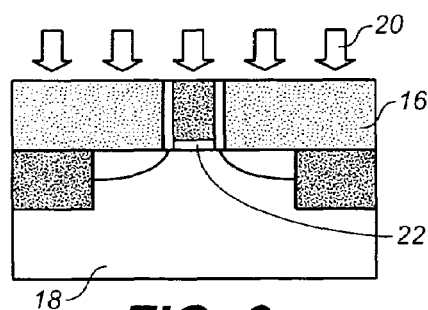
Figure 3:
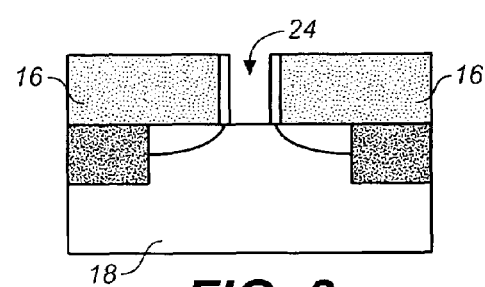
Figure 4:
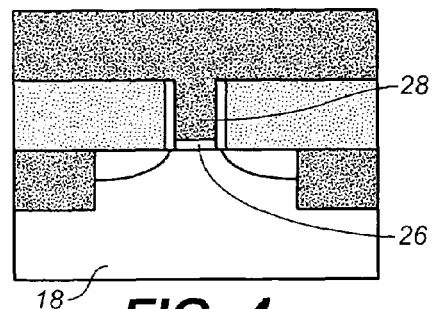
Figure 5:
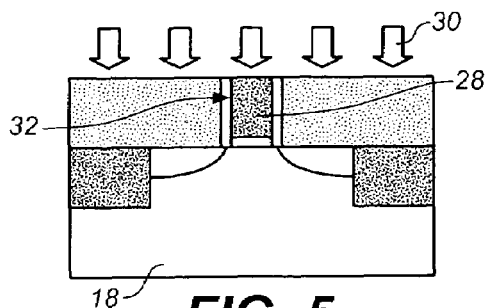
Figure 6:
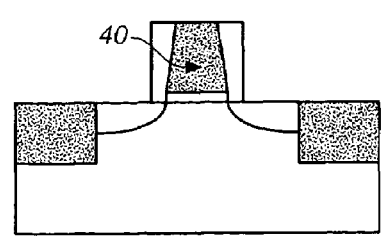
Figure 7:
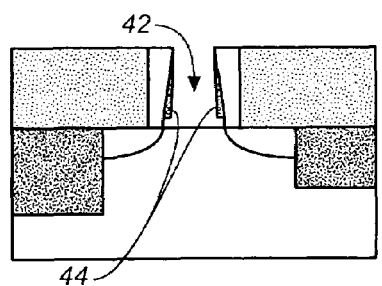

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

The present invention aims to improve the dummy gate profile, eliminate the re-entrant profile of gate grooves, and extend the damascene replacement scheme to future technology nodes.

Figure 8:
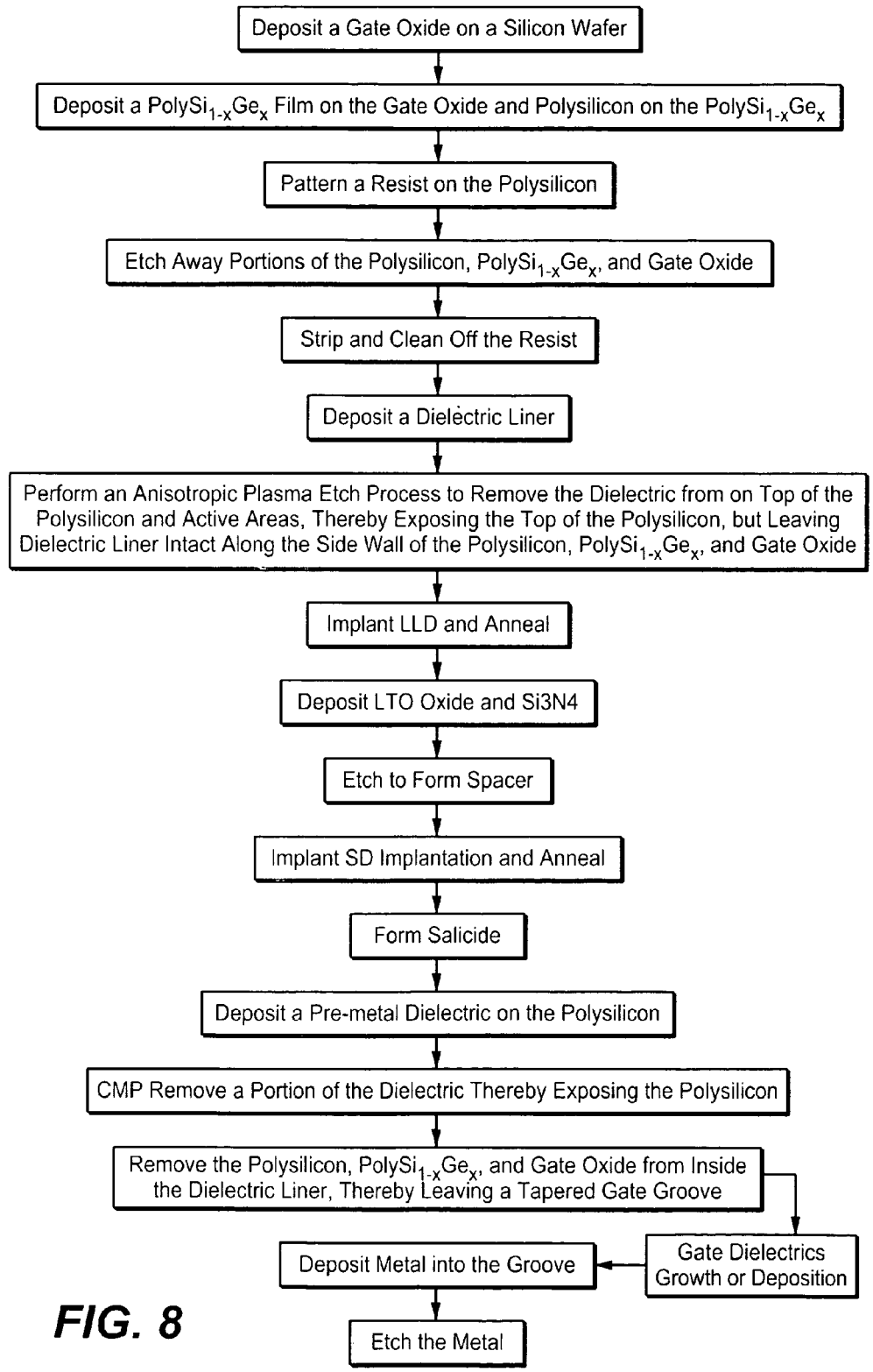
FIG. 8 is a flow chart which illustrates a damascene metal gate process which is in accordance with an embodiment of the present invention.
Figure 9:
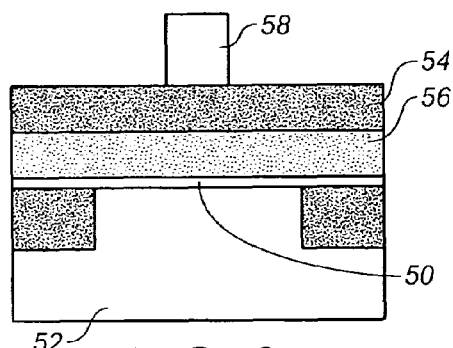
FIGS. 9-14 are views which relate to the process illustrated in FIG. 8.
Figure 10:
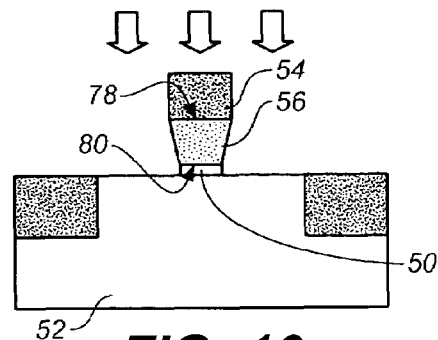
Figure 11:
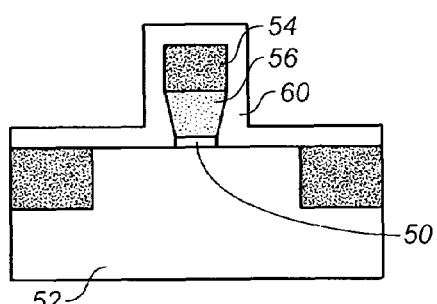
Figure 12:
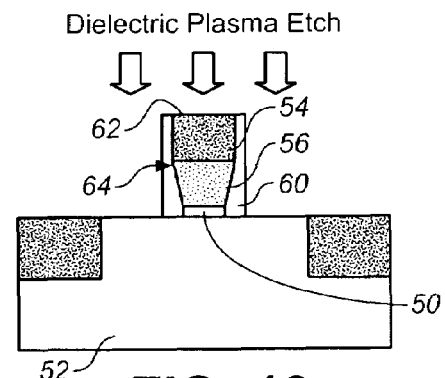
Figure 13:
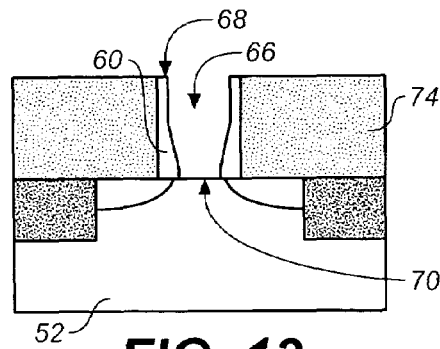
Figure 14:
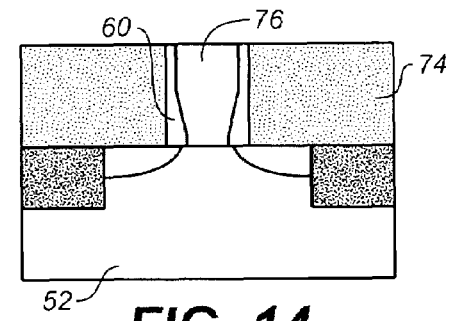

Instead of using pure polysilicon as dummy gate, the new method involves the use of a polysilicon/PolySi$_{1-x}$Ge$_x$ film stacks as a dummy gate. FIG. 8 illustrates the process on a step-and-step basis, and the progression of FIGS. 9 through 14 show the process being performed. Initially, as shown in FIG. 9, a gate oxide 50 is deposited on a silicon wafer 52, and then polysilicon 54 and PolySi$_{1-x}$Ge$_x$ 56 films are deposited. The Ge composition in the PolySi$_{1-x}$Ge$_x$ may be anywhere from 15 to 50 percent depending on the application. Then, a resist 58 is patterned on the polysilicon 54. The wafer 52 is then processed through dummy gate etching (i.e., portions of the polysilicon 54, PolySi$_{1-x}$Ge$_x$ 56, and gate oxide 50 are etched away) and the resist 58 is stripped and cleaned, thereby providing that which is shown in FIG. 10. After the desired degree of re-entrant profile has been achieved, a dielectric liner 60 (e.g. oxide or nitride, such as SiO2, Si3N4, or some other High-K dielectric) is deposited as shown in FIG. 11, which is followed by an anisotropic plasma etch to remove the dielectric on top of the polysilicon and active areas, thereby leaving the structure as shown in FIG. 12, wherein the top 62 of the polysilicon 54 is exposed, but the dielectric liner 60 is left intact along the side wall 64 of the polysilicon 54, PolySi$_{1-x}$Ge$_x$ 56, and gate oxide 50. The dielectric liner 60 on the side wall 64 prevents Si$_{1-x}$Ge$_x$ 56 from further oxidizing and wet etching, thus preserving the dummy gate profile and gate electrode dimension throughout the subsequent processes. Subsequently, the following steps are performed: LDD implantation and anneal, LTO oxide and Si3N4 deposition and etch to form spacer, SD implantation and anneal, salicide formation; depositing a pre-metal dielectric (such as a standard ILD oxide layer such as HDP oxide, FSG, or BPSG) on the polysilicon; and CMP removing a portion of the dielectric thereby exposing the polysilicon. Subsequently, the polysilicon 54, PolySi$_{1-x}$Ge$_x$ 56, and gate oxide 50 are removed from inside the dielectric liner 60, thereby leaving a tapered gate groove 66 as shown in FIG. 13. As shown, the groove 66 is wider at an opening 68 at its top 70 than at its bottom 72, proximate the silicon wafer 52. Then, a gate dielectric 74 such as SiO2, SiON, or a high-K dielectric is deposited. Finally, metal 76 is deposited into the groove 66, and is etched to provide the final structure shown in FIG. 14.

By manipulating the Ge composition in the PolySi$_{1-x}$Ge$_x$, the plasma etching chemsitries of Si$_{1-x}$Ge$_x$, oxidation, and oxide wet etching a re-entrant PolySi$_{1-x}$Ge$_x$ profile can be achieved (as shown in FIGS. 10-12), wherein the PolySi$_{1-x}$Ge$_x$ 56 is wider at its top 78, proximate the polysilicon 54, than it is at its bottom 80, proximate the gate oxide 50. This re-entrant dummy gate profile then yields a tapered gate groove 66 as shown in FIG. 13 after processing through source/drain formation and dummy gate removal. This tapered profile thus can achieve much smaller gate length, improve gate dielectric and metal gate electrode gap fill.

The capability of the manipulation of Si$_{1-x}$Ge$_x$ resides in the fact that the Si$_{1-x}$Ge$_x$ has highier oxidation rate than silicon, and germanium oxide is a volatile compound. The present method involves the use of F/Cl2 based chemistries for plasma etching of polysilicon portion as well as the use of Cl2/HBr/O2 based chemistries for etching the PolySi$_{1-x}$Ge$_x$ portion of the film stack. The inclusion of O2 in the etch chemistry results in a diminished Si$_{1-x}$Ge$_x$ dimension with respect to the polysilicon ($L_{siGe}/L_{Si}$=0.8 with $L_{siGe}$ and $L_{si}$ being the dimensions of the PolySi$_{1-x}$Ge$_x$ an silicon, respectively).

The profile of Si$_{1-x}$Ge$_x$ can be further manipulated by using a wet chemistry (such as SC1) that includes an oxidizing agent (such as H2O2 or O3) and an acid or base, such as NH4OH, to dissolve the oxidized surface. The film thickness of polysilicon/Poly Si$_{1-x}$Ge$_x$, and the composition of Ge in the Si$_{1-x}$Ge$_x$ alloy can also be adjusted to fit the requirements of the final profile and CDs.

Hence, the process has the following features:
(a). Deposition of polysilicon/Poly Si$_{1-x}$Ge$_x$ film stacks as damascene replacement dummy gate materials.
(b). Manipulation of the plasma etch chemistries, Ge composition, film stack thickness, and wet clean chemistries to achieve a desired re-entrant dummy gate profile.
(c). Dielectric liner deposition and plasma etching to provide a dielectric sidewall for preserving the gate groove profile.
(d). A unique gate profile.
(e). Scalability: can be used to achieve small gate length without the need of small line print.
(f). Prevention of the incomplete polysilicon strip and undercut after dummy gate dielectric removal.
(g). Improved subsequent new gate dielectric and metal gate electrode gap fill capability.

While embodiments of the present invention are shown and described, it is envisioned that those skilled in the art may devise various modifications of the present invention without departing from the spirit and scope of the appended claims.

What is claimed is:

1. A method of forming a metal gate on a substrate comprising: removing a plurality of layers of material from on top of the substrate between a liner which has sidewalls, thereby forming a groove which has a tapered profile wherein the liner has sidewalls which are parallel to each other at a top of the groove and wherein the sidewalls converge toward each other going to a base of the groove; depositing metal in the groove on the substrate, thereby forming said metal gate wherein the metal gate is in contact with the liner and has sidewalls which are parallel to each other in a top portion of the metal gate and which are in contact with the liner and which converge toward each other going to a base of the metal gate and which are in contact with the liner.

2. A method as recited in claim 1, further comprising depositing PolySi$_{1-x}$Ge$_x$ and polysilicon and then removing some of the PolySi$_{1-x}$Ge$_x$ to form the groove.

3. A method as recited in claim 1, further comprising depositing gate oxide on a wafer; depositing PolySi$_{1-x}$Ge$_x$ on the gate oxide; depositing polysilicon on the PolySi$_{1-x}$Ge$_x$; forming a resist pattern on the polysilicon; removing a portion of the polysilicon, PolySi$_{1-x}$Ge$_x$, and gate oxide to provide a tapered profile which converges from the polysilicon to the gate oxide.

4. A method as recited in claim 3, further comprising removing the resist; depositing a dielectric liner on the polysilicon, PolySi$_{1-x}$Ge$_x$, and gate oxide; and removing at least a portion of the dielectric liner, thereby exposing the polysilicon and leaving a remaining portion of the dielectric liner in contact with said polysilicon, PolySi$_{1-x}$Ge$_x$, and gate oxide.

5. A method as recited in claim 4, further comprising depositing a dielectric on the polysilicon and dielectric liner.

6. A method as recited in claim 5, further comprising removing a portion of the dielectric thereby exposing the polysilicon.

7. A method as recited in claim 6, further comprising depositing a dielectric liner on the polysilicon, PolySi$_{1-x}$Ge$_x$ and gate oxide and removing a portion of the dielectric liner as well as the polysilicon, PolySi$_{1-x}$Ge$_x$, and gate oxide, thereby leaving a tapered gate groove formed in the dielectric liner, and tapered from an opening at a top of said groove to a bottom of the groove.

8. A method as recited in claim 7, further comprising depositing metal in the groove and on the dielectric; and removing a portion of the metal from the dielectric.

9. A method of forming a metal gate on a substrate comprising: depositing gate oxide on the substrate; depositing PolySi$_{1-x}$Ge$_x$ on the gate oxide; depositing polysilicon on the PolySi$_{1-x}$Ge$_x$; forming a resist pattern on the polysilicon; removing a portion of the polysilicon, PolySi$_{1-x}$Ge$_x$, and gate oxide to provide a stack of polysilicon, PolySi$_{1-x}$Ge$_x$ and gate oxide, said stack having a tapered profile which converges from the polysilicon to the gate oxide; depositing a liner in contact with the polysilicon, PolySi$_{1-x}$Ge$_x$ and gate oxide; removing the stack to form a groove which has a tapered profile wherein the liner has sidewalls which are parallel to each other at a top of the groove and wherein the sidewalls converge toward each other going to a base of the groove; and depositing metal in the groove to form the metal gate on the substrate, wherein the metal gate is in contact with the liner and has sidewalls which are parallel to each other in a top portion of the metal gate and which are in contact with the liner and which converge toward each other going to a base of the metal gate and which are in contact with the liner.

10. A method as recited in claim 9, further comprising removing the resist; depositing a dielectric liner on the polysilicon, PolySi$_{1-x}$Ge$_x$, and gate oxide; and removing at least a portion of the dielectric liner, thereby exposing the polysilicon and leaving the dielectric liner in contact with said polysilicon, PolySi$_{1-x}$Ge$_x$, and gate oxide.

11. A method as recited in claim 10, further comprising depositing a dielectric on the polysilicon and dielectric liner.

12. A method as recited in claim 11, further comprising removing a portion of the dielectric thereby exposing the polysilicon.

13. A method as recited in claim 12, further comprising removing the polysilicon, PolySi$_{1-x}$Ge$_x$, and gate oxide from inside the dielectric liner, thereby leaving a tapered gate groove which is tapered from an opening at a top of said groove to a bottom of the groove.

14. A method as recited in claim 13, further comprising depositing metal not only in the groove but also on the dielectric; and removing a portion of the metal from the dielectric.

\* \* \* \* \*